United States Patent [19]

Davies et al.

[11] 4,227,157
[45] Oct. 7, 1980

[54] FREQUENCY COMPENSATED HIGH FREQUENCY AMPLIFIERS

[75] Inventors: Robert B. Davies; Don W. Zobel, both of Tempe, Ariz.

[73] Assignee: Motorola, Inc., Schaumburg, Ill.

[21] Appl. No.: 1,088

[22] Filed: Jan. 5, 1979

[51] Int. Cl.² ............................................. H03F 3/213
[52] U.S. Cl. .................................. 330/265; 330/294; 330/307; 330/311
[58] Field of Search ............... 330/262, 263, 265, 268, 330/271, 294, 307, 310, 311

[56] References Cited

U.S. PATENT DOCUMENTS 4,145,666   3/1979   Seki .................................. 330/294 X

OTHER PUBLICATIONS

Stafford et al., "A Monolithic Radiation-Hardened Operational Amplifier", *Solid State Technology*, May 1970, vol. 13, No. 5, pp. 67-72.

Primary Examiner—James B. Mullins
Attorney, Agent, or Firm—Maurice J. Jones, Jr.

[57] ABSTRACT

The disclosed amplifier includes first and second gain stages and first and second frequency compensating capacitors. The second gain stage has a first high impedance node coupled to the first gain stage, a second high impedance node, a first circuit coupled between the first and second high impedance nodes, a third high impedance node, and a second circuit coupled between the second and third high impedance nodes. The impedances at the first, second and third high impedance nodes are a function of frequency and the impedance at the second high impedance node is lower at any given frequency than the impedances at the first and third high impedance nodes. The first frequency compensating capacitor is coupled between the first and third nodes and the second frequency compensating capacitor is coupled between the third and second nodes.

8 Claims, 3 Drawing Figures

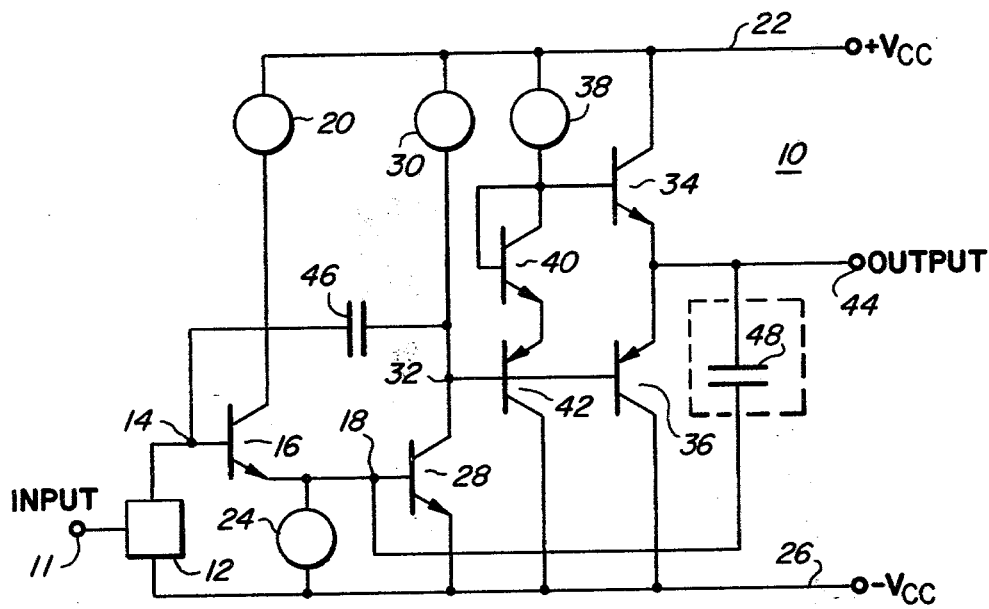
*Fig 1*
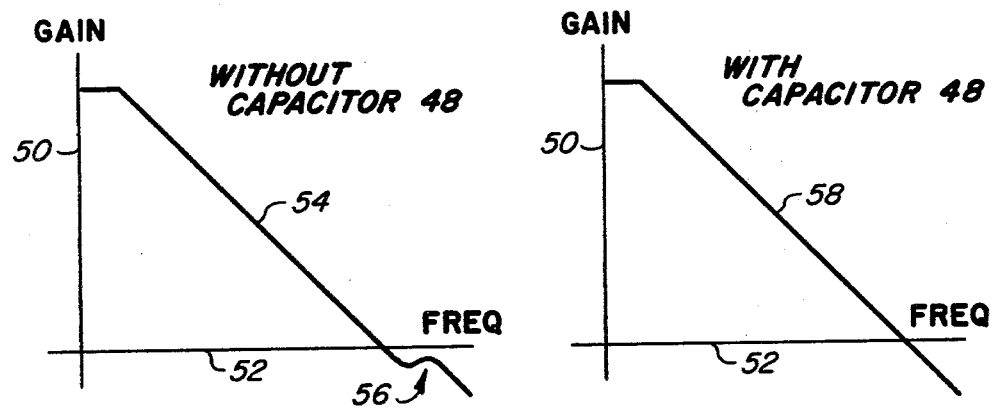
*Fig 2A*  *Fig 2B*

FREQUENCY COMPENSATED HIGH FREQUENCY AMPLIFIERS

BACKGROUND OF THE INVENTION

The subject invention relates to frequency compensation of high frequency amplifiers, and particularly amplifiers having three poles.

Many types of present day solid-state, high frequency amplifiers require frequency compensation techniques. For instance, even a simple, one stage common emitter amplifier having one transistor with a current source connected to the base thereof and a further current supply connected to the collector thereof can require high frequency compensation. The high impedance of the current source driver and stray capacitance creates a first pole at the base electrode of the transistor. Moreover, a second pole is created at the collector of the transistor due to parasitic capacitance, for instance. Because the two uncompensated poles are relatively close together in the frequency domain, the gain of the amplifier rolls off at 40 dB per decade near the unity gain frequency of the amplifier. Moreover, the amplifier provides significant voltage gain when the phase shift between the input and output signals is 360°. Thus, if the output terminal of the amplifier is electrically coupled to the input terminal thereof the conditions for undesirable oscillation are met.

To avoid such oscillation or instability, frequency compensating capacitors to ground have been connected to the input or output terminals of amplifiers. Also Miller or pole splitting capacitors have been utilized within such amplifiers.

Such high frequency compensation techniques have been found to be effective in and are utilized in many types of commercial monolithic integrated amplifier circuits operating at relatively low frequencies. Unfortunately, as the frequencies of such amplifiers are increased additional poles are created therein. If these new poles are spaced relatively close together or near other poles in the frequency domain, then undesirable peaking occurs in the gain frequency plot. This peaking can cause instability or oscillation. Additional poles are generated for example by the internal capacitance of transistors when the frequency of operation approaches $f_T$, which is the frequency where the absolute value of beta equals one. In the past, this problem has been partially solved by running more current through the transistor to increase the value of $f_T$ which results in moving the third pole further out along the frequency axis. However, as the unity gain frequency of the amplifier approaches about 5 Megahertz, it no longer is practicable to further increase the frequency response by increasing the current of the amplifier transistors.

SUMMARY OF THE INVENTION

Thus, the object of the invention is to provide an improved frequency compensated, high frequency amplifier which is suitable for fabrication in monolithic integrated circuit form.

In brief, one such amplifier in accordance with the invention includes first and second gain stages and first and second frequency compensating capacitors. The second gain stage has a first high impedance node coupled to the first gain stage, a second high impedance node, a first circuit coupled between the first and second high impedance nodes, a third high impedance node, and a second circuit coupled between the second and third high impedance nodes. The impedances at the first, second and third high impedance nodes are a function of frequency and the impedance at the second high impedance node is lower at any given frequency than the impedances at the first and third high impedance nodes. The first frequency compensating capacitor is coupled between the first and third nodes and the second frequency compensating capacitor is coupled between the third and second nodes.

BRIEF DESCRIPTION OF THE DRAWINGS

FIG. 1 is a partial block and partial schematic diagram of a frequency compensated, high frequency amplifier circuit of one embodiment of the invention; and FIG. 2 includes plots of the gain versus frequency characteristic of the amplifier of FIG. 1, with and without a further compensating capacitor.

DETAILED DESCRIPTION OF THE PREFERRED EMBODIMENT

FIG. 1 shows a monolithic integrated amplifier circuit 10 of one embodiment of the invention including an input terminal 11 connected to a first gain stage 12 which can include a differential amplifier and a differential-to-single ended converter of the type used in many prior art operational amplifiers. Gain stage 12 can be regarded as a variable current source having an output of gm $V_{IN}$ where gm is the transconductance and $V_{IN}$ is the magnitude of the input voltage at input terminal 11. The output terminal of first gain stage 12 is connected to a first high impedance node 14.

Input NPN transistor 16 of a second gain stage includes a base electrode which is also connected to first high impedance node 14, an emitter electrode which is connected to second high impedance node 18, and a collector electrode which is connected through current supply 20 to positive power supply conductor 22. Current sink 24 is connected between the emitter electrode of transistor 16 and the negative supply conductor 26.

Another NPN transistor 28 includes a base electrode connected to second high impedance node 18, an emitter electrode connected to negative supply conductor 26 and a collector electrode connected through current supply 30 to positive supply conductor 22. The collector electrode of transistor 28 is also connected to a third high impedance node 32 which drives complementary output transistors 34 and 36. Current supply 38 has one terminal connected to positive supply conductor 22, and another terminal connected to both the base electrode of complementary NPN output transistor 34 and the collector electrode of diode connected bias transistor 40. The emitter electrode of transistor 40 is connected to the emitter electrode of PNP bias transistor 42. Transistor 42 further includes a base electrode which is connected to the third high impedance node 32 and a collector electrode which is connected to negative supply conductor 26. The collector electrode of NPN output transistor 34 is connected to positive supply conductor 22 and the collector electrode of PNP output transistor 36 is connected to negative supply conductor 26. The emitter electrodes of transistors 34 and 36 are each connected to amplifier output terminal 44. The base electrode of transistor 36 is coupled to high impedance node 32.

A first frequency compensating capacitor 46 is connected between first high impedance node 14 and the third high impedance node 32. A further frequency compensating capacitor 48 has one terminal electrically coupled through PNP transistor 36 to the third high impedance node 32 and another terminal connected to the second high impedance node 18. The impedances at the first, second and third high impedance nodes, respectively designated by reference numbers 14, 18 and 31, are a function of frequency because of the internal capacitances of the transistors of circuit 10. Because transistor 16 is an emitter follower the second high impedance node 18 has a lower impedance at any given frequency than the impedances at the first and third high impedance nodes which are respectively generated by high impedance current supply 12 and common emitter transistor 28.

NPN transistors 16 and 28 form a Darlington pair. Output transistors 34 and 36 are emitter-follower output transistors which are biased class AB to prevent cross over distortion by devices 40 and 42.

Since transistors 34 and 36 are emitter-followers, the dynamic voltage magnitudes at node 32 and at output terminal 44 are quite similar during low frequency operation. Also, it can be assumed that the dynamic voltage magnitudes on high impedance node 14 and high impedance node 18 are identical, for low frequency operation. Under these conditions, first frequency compensation capacitor 46 is sufficient to frequency compensate amplifier 10. As the frequency of the input signal is increased, however, emitter-follower transistor 16 and emitter-follower transistors 34 and 36 provide less gain. Consequently, the impedances at the emitter of transistor 16 and at output terminal 44 begin to increase.

FIG. 2A shows the gain characteristic of amplifier 10 plotted generally along ordinate axis 50 versus frequency shown along abscissa axis 52. The gain versus frequency characteristic of amplifier 10 without the second compensation capacitor 48 is designated by line 54. At high frequencies a deformity 56 in line 54 occurs which is well known in the semiconductor industry as the "second stage bump". Deformity 56 results in undesirable instability and thereby limits the upper frequency of amplifier 10.

FIG. 2B shows the gain characteristic 58 of amplifier 10 with capacitor 48 added which does not have the deformity 56. FIG. 2B therefore shows that the maximum output frequency of amplifier 10 is increased by the addition of capacitor 48. This is believed to occur because at high frequencies capacitor 48 provides frequency selective negative feedback for stabilizing amplifier 10. Thus, capacitor 48 provides frequency selective negative feedback by reducing the gain in proportion to the frequency of operation. Such feedback does not occur until the frequency of operation has reached a value of one over the magnitude of capacitor 48 multiplied by the impedance at node 18. The value of capacitor 48 is generally empirically selected and is on the order of magnitude of the value of capacitor 46. More specifically in one commercial amplifier circuit capacitor 48 has a magnitude of 6 picofarads and capacitor 46 has a magnitude of 18 picofarads. Adding capacitor 48 increased the frequency response of the amplifier circuit from approximately 2.5 MHz to 8 MHz with the same degree of stability.

At lower frequencies, capacitor 48 appears to be connected to the same nodes as frequency compensating capacitor 46. This is because at the low frequencies, node 18 tends to follow the voltage on node 14. However as frequency increases, the voltage at node 18 no longer precisely follows the dynamic voltage at node 14 because the gain of transistor 16 falls off. Thus, as the frequency increases the impedances of nodes 14, 18 and 32 increase but the impedance of node 18 is always less than the impedances of nodes 14 and 32.

Accordingly, it has been discovered that the addition of frequency compensating capacitor 48 to amplifier circuit 10 provides an improved frequency compensated high frequency amplifier circuit. Although the exact mechanism of operation of capacitor 48 is not well understood, it has been experimentally verified that its addition increases the upper usable maximum frequency of amplifier 10 thereby meeting a long felt need in the field of solid-state amplifier circuits.

What is claimed is:

1. A frequency compensated high frequency amplifier, including in combination:
    a first gain stage;
    a second gain stage having a first high impedance node coupled to said first gain stage, a second high impedance node, non-inverting amplifier means electrically connected between said first and second high impedance nodes, a third high impedance node, inverting amplifier means having an input terminal coupled to said second high impedance node for receiving signals therefrom, said inverting amplifier means havig an output terminal connected to said third high impedance node for applying such signals to said third high impedance node after inverting such signals, the impedances at said first, second and third high impedance nodes being a function of frequency and said second high impedance node having a lower impedance at a given frequency than the impedances at said first and third high impedance nodes;
    first frequency compensating capacitive means coupled between said first and third high impedance nodes; and
    second frequency compensating capacitive means coupled between said third and second high impedance nodes.

2. The amplifier circuit of claim 1 wherein said non-inverting amplifier means includes:
    a bipolar transistor having emitter, base and collector electrodes, said base electrode being directly connected to said first high impedance node and said emitter electrode being directly connected to said second high impedance node; and
    current supply means connected to said collector electrode.

3. The amplifier circuit of claim 2 further including current sink means electrically connected to said emitter electrode.

4. The amplifier circuit of claim 1 wherein said inverting amplifier means includes:
    a bipolar transistor having an emitter, base and collector electrodes, said base electrode being connected to said second high impedance node; and
    current supply means connected to said collector electrode.

5. The amplifier circuit of claim 1 further including:
    circuit means connected in a series circuit with said second frequency compensation capacitive means; said series circuit being coupled between said third high impedance node and said second high impedance node, said circuit means including a pair of complementary output transistors which provide the output signal for the amplifier.

6. The amplifier circuit of claim 5 further including bias means for said complementary output transistors.

7. A second gain stage for a frequency compensated high frequency amplifier having a first gain stage, the high frequency amplifier being suitable for being manufactured in monolithic integrated circuit form, the second gain stage including in combination:
a first high impedance node coupled to the first gain stage;
a second high impedance node;
a non-inverting amplifier having a first transistor with an emitter electrode, a collector electrode and a base electrode, said base electrode of said first transistor being connected to said first high impedance node, said emitter electrode of said first transistor being coupled to said second high impedance node;
a first current supply connected to said collector electrode of said first transistor;
current sink means connected to said emitter electrode of said first transistor;
a third high impedance node;
an inverting amplifier having a second transistor with an emitter electrode, a base electrode and a collector electrode, said base electrode of said second transistor being connected to said second high impedance node for receiving signals therefrom and said collector electrode of said second transistor being connected to said third high impedance node, said second transistor thereby being adapted to apply inverted signals to said third high impedance node;
a second current supply connected to said third high impedance node;
a pair of complementary output transistors being electrically coupled between said third high impedance node and an output terminal for the high frequency amplifier;
the impedances at said first, second and third high impedance nodes being a function of frequency and said second high impedance node having a lower impedance at a given frequency than the impedances of said first and third high impedance nodes;
first frequency compensating capacitive means coupled between said first and third nodes; and
second frequency compensating capacitive means coupled between said output terminal of the high frequency amplifier and said second high impedance node.

8. The circuit of claim 7 further including in combination:
bias circuit means coupled with said pair of complementary transistors; and
a third current supply connected to said bias circuit means.

* * * * *